United States Patent [19]

Blikken et al.

[11] Patent Number: 4,572,160
[45] Date of Patent: Feb. 25, 1986

[54] HELIOTROPIC SOLAR HEAT COLLECTOR SYSTEM

[76] Inventors: Wendell A. Blikken; Marguerite A. Blikken, both of 952 S. Grove St., Ypsilanti, Mich. 48197

[21] Appl. No.: 686,075

[22] Filed: Dec. 24, 1984

[51] Int. Cl.[4] ............................................. F24J 2/10
[52] U.S. Cl. ..................................... 126/439; 126/438
[58] Field of Search .............. 126/419, 440, 425, 438, 126/432, 439, 443, 445, 450

[56] References Cited

U.S. PATENT DOCUMENTS

| 3,905,352 | 9/1975 | Jahn | 126/438 |
| 4,038,964 | 8/1977 | Drew | 126/443 |
| 4,195,620 | 4/1980 | Rust | 126/439 |
| 4,401,103 | 8/1983 | Thompson | 126/419 |
| 4,429,178 | 1/1984 | Prideaux et al. | 126/425 |

FOREIGN PATENT DOCUMENTS 143362  9/1981  Japan .................................. 126/439

Primary Examiner—James C. Yeung
Attorney, Agent, or Firm—Barnes, Kisselle, Raisch, Choate, Whittemore & Hulbert

[57] ABSTRACT

A solar energy collector which includes a sun ray window adjacent an array of flat reflector panels each positioned to direct solar energy to a major collector unit on each side of the unit utilizing a secondary reflector plate. A heliotropic mount is provided for the reflector panels. A multiple blind assembly is optionally positioned in the solar window carrying photovoltaic units to convert solar energy and limit the energy selectively to the major collector unit when maximum storage capacity is reached.

3 Claims, 4 Drawing Figures

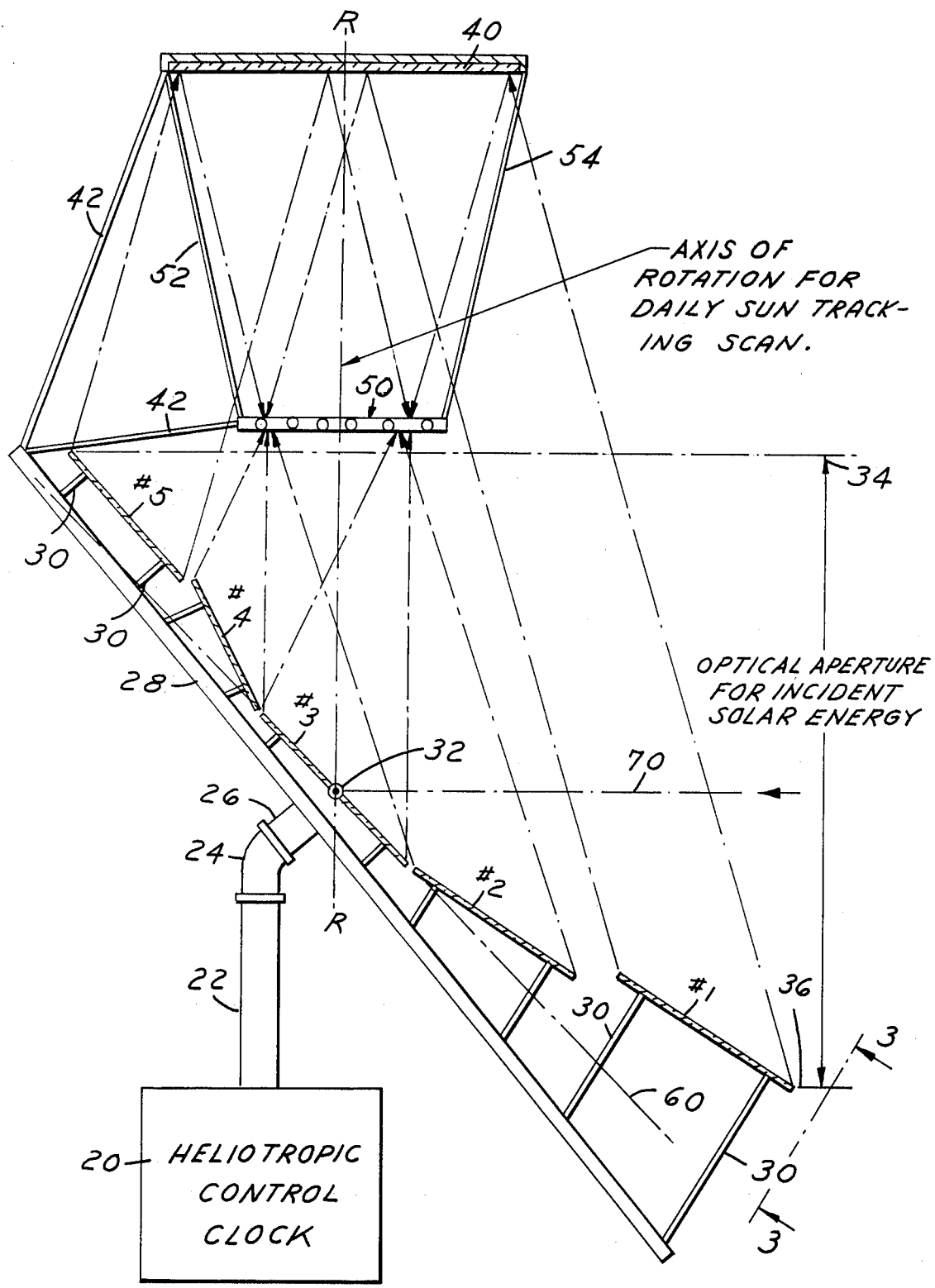

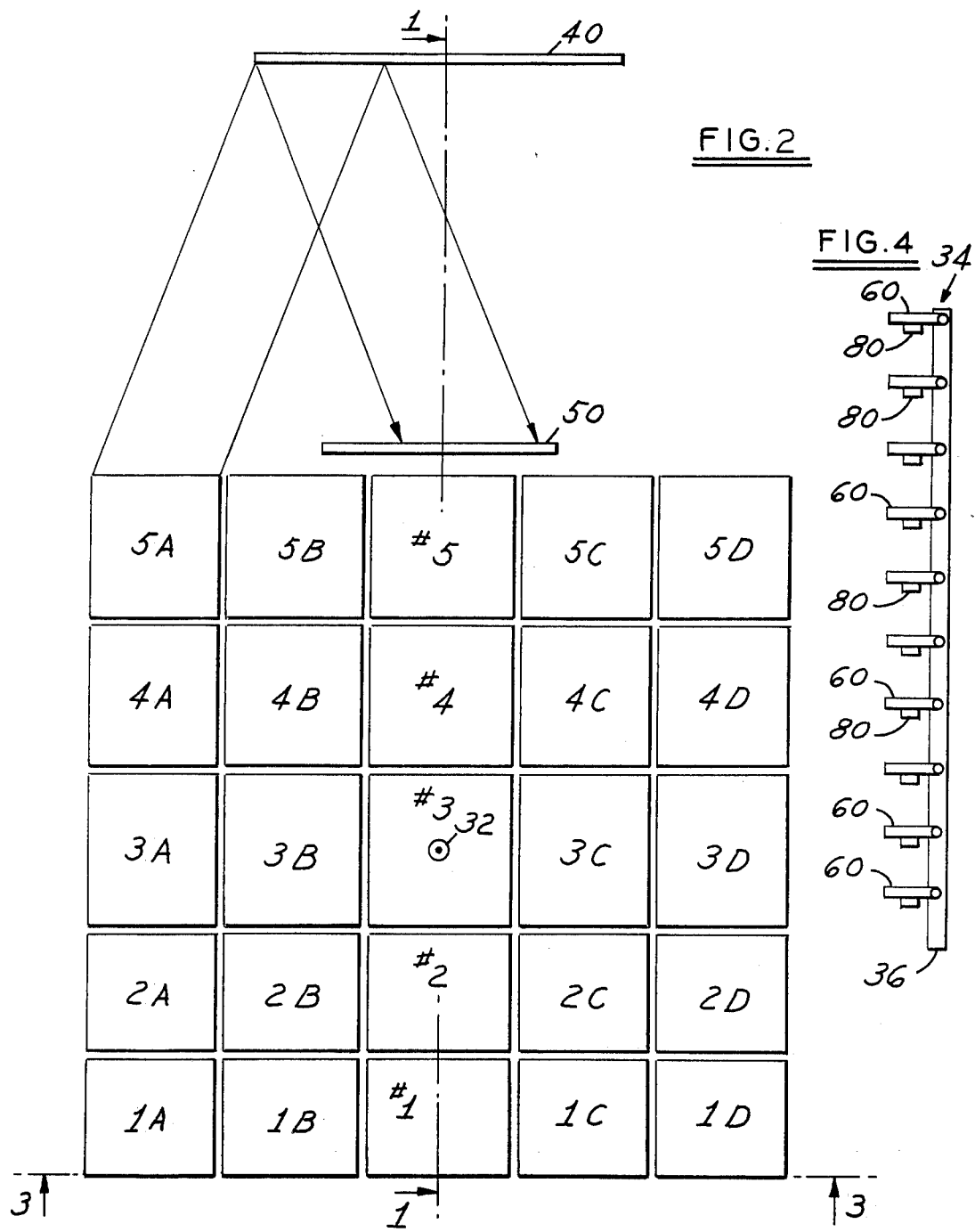

HELIOTROPIC SOLAR HEAT COLLECTOR SYSTEM

FIELD OF INVENTION

The use of a reflector bank to collect solar rays and direct them to a collector.

BACKGROUND OF THE INVENTION

The shortage of available fossil fuel and the high cost, together with the dependency on foreign sources has stimulated a search for devices to utilize and store solar energy. One example of a collector system is found in a U.S. Patent to Clark, No. 4,192,289, dated March 11, 1980, wherein there is shown a reflector composed of a plurality of discrete planar reflector segments arranged in paraboloidal shape which directs reflected rays to a central collector plate. Another example is disclosed in a U.S. Patent to Vigoureax, No. 4,084,581, issued Apr. 18, 1978.

It is an object of the present invention to provide a reflector array which can receive the direct rays of sun with no shadowing from the collector unit and which can be made in such a way that both sides of a collector may be utilized.

A further object is the provision of an array of reflectors which can be formed of flat elements, either mirror glass or polished metal, which are obtainable at very reasonable cost.

A still further object of the invention lies in the disposition of the reflector elements such that a single array can be mounted for heliotropic (sun tracking) motion while some of the elements are positioned to reflect to one side of a collector and other elements are positioned to reflect to the other side of a collector through a reverse reflector plate.

Other objects and features of the invention will be apparent in the following description and claims in which the principles of the invention are set forth together with details directed to persons skilled in the art to enable use of the invention, all in connection with the best mode presently contemplated for the invention.

BRIEF DESCRIPTION OF THE DRAWINGS

DRAWINGS accompany the disclosure and the various views thereof may be briefly described as:

FIG. 1, a side view, partially in section, of the reflector array and collector plate taken on line 1—1 of FIG. 2.

FIG. 2, an elevational view taken in the direction of the sun's rays as they will impact on the reflector elements.

FIG. 3, a sectional view on line 3—3 of FIG. 1.

FIG. 4, a side diagrammatic view of the solar window with venetian blind elements.

DETAILED DESCRIPTION OF THE INVENTION AND THE MANNER AND PROCESS OF USING IT

The apparatus to be described will be mounted for movement to follow the sun so that the impact of the sun's rays will be as direct as possible on the various reflector elements. This is called "tracking the sun" or a heliotropic movement. The motion must move the system to follow the sun as it moves relative to the earth from sunrise to sunset but also should be reponsive to the angle of the sun as it changes with the seasons wherein it has a highest angle on June 21 and a lowest angle on December 21. This will change with location of the collector site relative to the equator.

The present disclosure is based on the assumption that sun tracking apparatus is known in the art as shown in the above-referenced U.S. Pat. No. 4,192,289 and as is well known in clock operated drives for telescopes. It is also assumed that collector units are well known in the art and may be illustrated diagrammatically. These can be photovoltaic cells of silicon or selenium or equivalent which absorb energy, or a liquid filled collector may be used for heating a liquid in any heat exchange system.

The reflector display to be described utilizes flat surfaces, either mirror glass, or polished metal, which reflect all wave lengths as distinguished from a lens which may be limited to some wave lengths.

With reference to the drawings, in FIG. 1, a view partially in section illustrates a mounting structure base element 20 with a rotation column rising from the base to a universal joint structure 24 having a frame support 26 secured to a support frame 28 shown diagrammatically in FIG. 1.

In FIG. 2, an array of 25 reflector elements is illustrated and the frame 28 underlies and supports each of these elements through struts 30 of varying lengths as shown in FIG. 1. Three struts per panel is desirable disposed triangularly. These struts are preferably adjustable in length through a screw connection or telescoping elements not shown.

The primary reflectors shown in the sectional view of FIG. 1 (section R—R of FIG. 2) are numbered 1, 2, 3, 4 and 5. The remaining 20 reflectors are identified with the letters A, B, C, D as shown in FIG. 2. Thus, the reflectors in the first tier are identified as 1A, 1B, 1, 1C and 1D. Each reflector is supported on the frame 28 independent of the others. A center mark 32 in FIGS. 1 and 2 marks the elevation axis of rotation and azimuthal axis of rotation of the heliotropic driven support frame. The base unit 20 will contain the heliotropic control click and/or a photocell sun tracker unit.

The axis R—R in FIG. 1 is in a North-South plane and must stay in that plane throughout the movement of the multiple panel reflector array. The array will change angle to accommodate the elevation of the sun relative to the horizon. Thus, the pseudo parabolic section rises from sunrise to noon and then descends to sunset. The axis R—R of rotation for the daily solar scan is also the axis of symmetry for the reflector 40 and the collector assembly 50 (or the back-to-back collector and photovoltaics) and center 32.

The center 32 is also the horizontal axis for the seasonal tracking of the sun. This is the scan for which the reflector 40 and the attached collector 50 must move on a track (not shown), centered on the horizontal axis above referenced.

The optical solar aperture is shown in FIG. 1 between arrows 34 and 36. The secondary reflector plate 40 is mounted on struts 42 to frame 28 and must track frame 28 for sun elevation changes in order to maintain the angle $\alpha$ at 90°. Hence, rotation is not necessary, but angular translation about center 32 might be required on an arc to maintain the angle $\alpha$ at 90°. This mounting simplifies the mechanical connection for collector plate 50.

The reflector plate 40 is comprised of a single plate. The collector assembly 50 is supported on struts 52, 54 or mechanical equivalents to maintain its relative position with respect to reflector 40 and the array of plates on support 28. The struts must be such that they cause minimal shadowing of the reflector plate.

As indicated, the collector plate assembly, shown diagrammatically, can be a photovoltaic unit utilizing silicn or selenium cells or the equivalent, and may be designed to collect energy on each side. A liquid filled collector may also be used. This could be a liquid filled collector unit utilized oil or water for heat transfer. Photovoltaic units may be used back to back with the liquid filled unit to perform different functions simultaneously.

A dot-dash line 60 indicates a plane of reference for the primary reflectors. Reflector #3 lies in the plane of reference and is at angle 0°. The other reflectors can be arrayed at varying angles for greatest efficiency and minimum path length. For example, reflector #1 is at an angle of arc tangent 0.15. Reflector #2 is at an angle of arc tangent 0.16. Reflector #3 is at an angle 0. Reflector #4 is at an angle of arc tangent 0.24. Reflector #5 is at an angle of arc tangent 0.14. The sun's rays are all parallel to line 70 through the aperture 34–36.

The collector assembly should include a selective transmission-reflective window of the type shown in FIG. 1.5.1 of Chapter 1, Page 8, of Solar Section Surfaces by O. P. Agnihotri and B. K. Gupta (Publisher John Wiley & Sons, N.Y., N.Y. 1981). This means the incoming rays will readily pass through the window but the heat rays from the collector will be blocked from escaping through the same window.

The positioning of the reflectors #1, 2, 3, 4 and 5 in FIG. 1 are calculated to direct sun rays to either the near side of the collector 50 or to the secondary reflector 40. The parallel lines from each reflector illustrate that primary reflectors #1 and #5 direct the incoming rays to the secondary reflector 40. Primary reflectors #2, 3 and 4 direct the rays to the near side of the collector 50. Similarly, the energy reaching the secondary reflector 40 is direct to the far side of the collector 50. Thus, the outer 16 primary reflectors direct energy to the secondary reflector and the inner 9 reflectors 2, 2B, 2C, 3, 3B, 3C and 4, 4B, 4C direct energy to the near side of the collector 50.

The 20 reflectors are all positioned relative to the reference plane 60 to direct the incoming rays as indicated above with respect to reflectors #1, 1A, 1B, 1C and 1D. The A, B, C and D series will have a compound angle with respect to the reference plane, that is, a tilt toward the center 32 in the vertical and horizontal planes as viewed in FIG. 2. In normal circumstances, the third series might need only a single angle disposition relative to the reference plane since it is disposed at the center of the array transverse to the #1, 2, 3, 4 and 5 series.

The collector panel is mounted independently of the basic frame 28. The connections to it, whether electrical or hydraulic, will be simplified and the efficiency will not be significantly affected.

The Operation

The operation of the system will be apparent from the above description. Solar energy will enter the window 34–36 and impact on the 25 flat reflectors, each of which will direct the energy to the near side or the far side of the collector 50. The entire frame will be disposed at a proper angle to the solar source dependent on the time of day and year and the latitude of the location.

Energy will be collected by both sides of the collector and conducted by suitale means to a storage unit or a utility device for immediate use. It will be appareciated that the device, while extremely efficient, is composed of elements which are relatively inexpensive to manufacture. The mirror reflector plates are flat, inexpensive plates which can be mounted mechanically in the disclosed support frame. The plates can be mounted in any convenient location relative to the reference plane and the collector plates or secondary reflector, as long as they do not "shadow out" an adjacent plate.

In FIG. 4, a vertical side view of a modified vertical solar aperture 34–36 is shown with a series of ten horizontal slats 60 pivoted on suitable axes at the plane of the aperture. This is, in a sense, a venetian blind. The slats are preferably horizontal to be unaffected by the daily scan of the sun where the window is fixed to an enclosing building.

These slats 60 can serve a two-fold function. First, they can provide a limitng action to the heating of the collector 50 when the storage capacity is at maximum temperature; and, secondly, when the slats are turned to cut off the entering rays of the sun from the collector, the slats can themselves become collectors by supporting a series of voltaic cells 80 to convert solar energy to electric energy. Thus, there will be no loss of solar energy.

These slats may be operated in clusters of two or more to select the portion of the incoming solar energy for distribution to each of the two converters, i.e., the collector 50 or the photovoltaic cells on the exposed slats. Thus, there can be a ratio of distribution to the various collectors from zero to all or all to zero.

We claim:
1. A solar energy collector which comprises:
   (a) a two-sided collector panel,
   (b) a secondary reflector panel positioned adjacent said collector panel, and
   (c) an array of flat primary reflector panels respectively positioned to direct incoming solar energy in the direction of said collector panel and said secondary reflector panel, a first series of adjacent primary reflector panels centrally of said array being arranged in a generally two-dimensional parabolic assembly to direct incoming rays to a first side of said collector panel, and a second series of primary reflector panels bordering said first series being disposed to direct incoming rays past said collector panel to said secondary reflector panel positioned on the other side of said collector panel to direct reflected rays to said other side of said collector panel.

2. A solar energy collector as defined in claim 1 in which a solar receiving area is open to said array of reflectors, and a series of movable blinds in said receiving area is positioned and provided to selectively restrict the amount of sunlight admitted to said array.

3. A solar energy collector as defined in claim 2 in which energy receiving cells are positioned on said blinds to convert sunlight to energy when said blinds are disposed in a position to close said solar receiving area from said array of primary reflectors.

* * * * *